(12) United States Patent
Baumgartner et al.

(10) Patent No.: US 11,867,742 B2
(45) Date of Patent: Jan. 9, 2024

(54) METHOD AND MEASURING ASSEMBLY FOR DETECTING FAULTS ON ELECTRICAL LINES

(71) Applicant: Siemens Aktiengesellschaft, Munich (DE)

(72) Inventors: Robert Baumgartner, Puchheim/Bhf. (DE); Claus Seisenberger, Neufrannhofen (DE)

(73) Assignee: Siemens Aktiengesellschaft, Munich (DE)

( * ) Notice: Subject to any disclaimer, the term of this patent is extended or adjusted under 35 U.S.C. 154(b) by 287 days.

(21) Appl. No.: 17/295,970

(22) PCT Filed: Oct. 21, 2019

(86) PCT No.: PCT/EP2019/078502
§ 371 (c)(1),
(2) Date: May 21, 2021

(87) PCT Pub. No.: WO2020/104124
PCT Pub. Date: May 28, 2020

(65) Prior Publication Data
US 2022/0011359 A1    Jan. 13, 2022

(30) Foreign Application Priority Data
Nov. 21, 2018 (DE) .......................... 102018219959.0

(51) Int. Cl.
*G01R 31/11* (2006.01)
*G01R 31/52* (2020.01)

(52) U.S. Cl.
CPC .............. *G01R 31/11* (2013.01); *G01R 31/52* (2020.01)

(58) Field of Classification Search
CPC ......... G01R 31/11; G01R 31/52; G01R 31/54
See application file for complete search history.

(56) References Cited

U.S. PATENT DOCUMENTS 3,727,128 A * 4/1973 McFerrin ............... G01R 31/11
324/533
4,887,041 A * 12/1989 Mashikian ............. G01R 31/11
324/541

(Continued)

FOREIGN PATENT DOCUMENTS

| CN | 108333476 A | 7/2018 |
|----|-------------|--------|
| DE | 10024085 C1 | 1/2002 |

(Continued)

*Primary Examiner* — Patrick Assouad
*Assistant Examiner* — Demetrius R Pretlow
(74) *Attorney, Agent, or Firm* — Laurence A. Greenberg; Werner H. Stemer; Ralph E. Locher

(57) ABSTRACT

A method for detecting faults on an electrical line includes feeding a measurement signal to a first location on the line by using a measuring assembly, receiving a reflected measurement signal at the first location, and determining a fault location on the line on the basis of the period of time until the reflected measurement signal is received while considering a line attenuation. A reflection location on the line where the measurement signal is reflected is used, and the line attenuation is determined on the basis of the level of the reflected measurement signal received at the first location. A corresponding measuring assembly is also provided.

12 Claims, 5 Drawing Sheets

(56) References Cited

U.S. PATENT DOCUMENTS

| | | | |
|---|---|---|---|
| 5,128,619 A | 7/1992 | Bjork et al. | |
| 5,352,984 A * | 10/1994 | Piesinger | G01R 31/11 324/528 |
| 5,461,318 A * | 10/1995 | Borchert | G01R 1/025 324/532 |
| 5,530,365 A * | 6/1996 | Lefeldt | G01R 31/11 324/543 |
| 5,534,783 A * | 7/1996 | Meyer | G01R 31/11 324/532 |
| 6,417,672 B1 | 7/2002 | Chong | |
| 6,781,386 B2 | 8/2004 | Le Henaff | |
| 7,295,018 B2 * | 11/2007 | Oakley | G01R 31/11 324/533 |
| 7,808,247 B1 * | 10/2010 | Lo | G01R 31/58 324/533 |
| 2002/0125891 A1 * | 9/2002 | Allan | G01R 31/11 324/534 |
| 2003/0052694 A1 * | 3/2003 | Dindis | G01R 31/083 324/527 |
| 2004/0183544 A1 * | 9/2004 | Allan | G01R 31/58 324/533 |
| 2004/0230387 A1 * | 11/2004 | Bechhoefer | G01R 31/11 702/58 |
| 2005/0225329 A1 * | 10/2005 | Oakley | G01R 31/11 324/533 |
| 2006/0097730 A1 * | 5/2006 | Park | G01R 31/11 324/534 |
| 2013/0124119 A1 * | 5/2013 | Reynaud | G01R 31/11 702/59 |
| 2014/0266238 A1 * | 9/2014 | Furse | G01R 31/2841 324/533 |
| 2014/0320139 A1 * | 10/2014 | Renforth | G01R 31/11 324/415 |
| 2015/0222511 A1 * | 8/2015 | Fertner | H04L 43/0864 370/252 |
| 2015/0349899 A1 * | 12/2015 | Butler | G01R 35/005 375/227 |
| 2016/0124449 A1 * | 5/2016 | Heenan | G01N 27/00 307/117 |
| 2016/0139194 A1 * | 5/2016 | Cohen | G01R 31/088 324/533 |
| 2017/0023629 A1 | 1/2017 | Berge et al. | |
| 2017/0063429 A1 * | 3/2017 | Flask | H04Q 5/00 |
| 2017/0199235 A1 * | 7/2017 | Jeon | G01R 31/58 |
| 2017/0373749 A1 * | 12/2017 | Williams | H04B 10/071 |
| 2018/0227014 A1 * | 8/2018 | Fertner | H04B 3/46 |
| 2019/0271732 A1 * | 9/2019 | Janssen | G01K 1/14 |
| 2020/0110124 A1 * | 4/2020 | Schweitzer, III | G01R 31/085 |
| 2020/0124656 A1 * | 4/2020 | Layer | G01R 31/088 |
| 2021/0063249 A1 | 3/2021 | Janssen | |

FOREIGN PATENT DOCUMENTS

| | | |
|---|---|---|
| DE | 102005014993 A1 | 12/2005 |
| DE | 60118586 T2 | 11/2006 |
| DE | 212011100136 U1 | 5/2013 |
| DE | 102017215517 B3 | 10/2018 |
| DE | 102017214996 A1 | 2/2019 |
| EP | 1156341 A2 | 11/2001 |
| WO | 2018086949 A1 | 5/2018 |

* cited by examiner

METHOD AND MEASURING ASSEMBLY FOR DETECTING FAULTS ON ELECTRICAL LINES

BACKGROUND OF THE INVENTION

Field of the Invention

The invention relates to a method for fault detection on electrical lines in which a measurement signal is fed in at a first location on the line by using a measuring assembly, a reflected measurement signal is received at the first location, and a fault location on the line is determined on the basis of the time duration until reception of the reflected measurement signal while taking a line attenuation into consideration. The invention also relates to a measuring assembly for fault detection on an electrical line, comprising a signal generator apparatus disposed at a first location on the line and configured to feed a measurement signal into the line, a reception apparatus disposed at the first location and configured to receive a reflected measurement signal, and an evaluation apparatus configured to determine a fault location on the line on the basis of the time duration until reception of the reflected measurement signal while taking a line attenuation into consideration.

Malfunctions sometimes occur on overhead lines and underground cables for power transmission, for example because the line has been torn down, an underground cable has been cut through, or a line short-circuit or a ground short is present. This can result in a relatively long interruption to the electrical supply, most of all in the case of very long lines, when the location where the fault has occurred is not known.

In addition to the current-carrying lines in which a fault can at least be detected immediately, current-free lines are also of interest, for example the dedicated return conductor in HVDC lines (HVDC: high-voltage direct current transmission) which in normal circumstances do not carry voltage.

Reflectometry methods are often used for fault detection and fault localization on high-voltage overhead lines. A device for the transmission and reception of measurement signals is coupled to the line here at the beginning of the line. This device generates, for example periodically, a measurement pulse that is coupled into the line. This pulse signal propagates along the overhead line. If a line fault occurs on a line, this causes a step in the line impedance at the fault location. A ground short causes an impedance close to zero, while a line break brings about a high-resistance fault location.

A measurement signal that appears at the impedance step at the fault location is partially or fully reflected at this location. The reflected signal travels back to the measurement device. The signal can be detected there, and the position of the fault can be determined from the transit time.

As a result of the line attenuation, reflections from more remote fault locations have a lower level than those from nearby fault locations. If, for fault detection, a fixed threshold value is used for the signal level of a fault, distant faults cannot be recognized, or only with low sensitivity. For this reason in the prior art, for example when the device is installed, a compensation factor is set that raises the signal level depending on the transit time. The line attenuation is consequently ascertained once and set permanently during the installation. A fixed threshold for the detection of faults is derived.

A method for determining the distance of a reflection location on an electrical conductor, in which a frequency-modulated and/or phase-modulated electrical feed signal is generated, is known from the not-yet-published German patent application 102017214996.5 dated Aug. 28, 2017. The feed signal is fed into the conductor at a measurement location. A signal, or measurement signal, reflected to the measurement location is measured at the measurement location. A distance value indicating the distance of the reflection location is ascertained on the basis of the frequency and/or the phase of the measurement signal and on the basis of the current frequency and/or phase of the feed signal at the time at which the measurement signal arrives.

SUMMARY OF THE INVENTION

On the basis of known methods for fault detection on an electrical line, the invention addresses the object of providing a method with which a comparatively accurate determination of a fault location can be achieved, in particular in the case of long electrical lines.

The invention achieves this object through a method for fault detection on electrical lines in which a measurement signal is fed in at a first location on the line by using a measuring assembly, a reflected measurement signal is received at the first location, a fault location on the line is determined on the basis of the time duration until reception of the reflected measurement signal while taking a line attenuation into consideration, a reflection location on the line is used at which the measurement signal is reflected, and the line attenuation is determined on the basis of the level of the reflected measurement signal received at the first location.

The first location is, for example, a first line end or another point along the line at which the measuring assembly is attached.

The fault location is the location of a fault on the line. The fault location is often positioned between the first location and the reflection location. The fault location can, however, also lie—as seen from the first location—behind the reflection location, since the reflection location does not have to bring about a total reflection of the measurement signal.

A reflection location here is a location along the line, i.e. for example a second conductor end with a galvanic connection to a downstream electrical apparatus. An open conductor end, i.e. a line end without such a galvanic connection, can also be a reflection location.

The method according to the invention gives consideration to the fact that a line attenuation in, for example, overhead lines that are in operation, does not remain constant, but changes as a result of environmental influences (e.g. the ambient temperature). The actual line attenuation can thus differ from the line attenuation that has been set, as a result of which the sensitivity of the fault detection varies over the length of the line in former methods. In the case, in particular, of very long lines, for example with a length of more than 100 km, the line attenuation can vary by several decibels, as a result of the temperature changes within even a single day.

The central idea of the present invention is to use a reflection such as, for example, an end reflection at a second line end of a high-voltage overhead line, in order to determine a current line attenuation and thereby to adjust a detection threshold for faults. This adjustment can, for example, take place continuously, i.e. with a short time cycle of, for example, a few minutes.

It is an advantage of the method according to the invention that the detection sensitivity for faults is constant over the full length of the line. The detection sensitivity thus remains constant even when the line attenuation changes. The detection threshold can, further, be set more sensitively, since no variations in the sensitivity occur over the length of the line. The detection of high-resistance faults is thus also possible.

Slowly developing faults can furthermore be detected, for example if a tree is growing in the direction of the high-voltage line. In systems known until now, on the other hand, a high-pass filter is often inserted into the detection system, in order to eliminate slow variations.

In the case, in particular, of very long lines, the variations in attenuation are considerable, which means that with the method of the invention the sensitivity in the far region can be significantly stabilized.

In one preferred embodiment of the method of the invention, the fault location is transmitted to a control center and used to initiate switching off of the line or an affected line segment. A servicing or repair at the fault location can also be initiated by the control center.

In a further preferred embodiment of the method of the invention, an impedance apparatus is used at the reflection location.

In a further preferred embodiment of the method of the invention, a choke coil is used for the impedance apparatus. This is an advantage, since a choke coil brings about a sharp step in the impedance at the end of the line which causes an end reflection and thereby makes the measuring method of the invention possible.

In a further preferred embodiment of the method of the invention, the choke coil is used as part of a power line communication apparatus. On lines with PLC (power line communication) a choke is typically connected in series at both ends of the line to prevent the communication signals transmitted over the power line from propagating beyond the end of the line. Such a choke forms a high impedance at signal frequencies in the kilohertz range.

In a further preferred embodiment of the method of the invention, a short circuit between the line and ground is used for the impedance apparatus.

In a further preferred embodiment of the method of the invention, a measurement signal in the kilohertz frequency range is used. A kilohertz frequency range comprises, for example, frequencies between 1 kHz and 1000 kHz. This is an advantage, since such a measurement signal in particular can be reflected by a choke.

In a further preferred embodiment of the method of the invention, a measurement signal with a frequency in the frequency range from 50 kHz up to 5 MHz is used. This is an advantage, because it has been found that this frequency range is particularly well-suited to a reflection measurement. This applies in particular to long lines with a length of more than 100 km.

In a further preferred embodiment of the method of the invention, a line with a length of more than 100 km is used for the electrical line.

In a further preferred embodiment of the method of the invention, the line attenuation is compensated in that the level of the measurement signal reflected from the reflection location is normalized to zero decibels, and the level of the reflected measurement signal is raised linearly along the length of the line. This is an advantage, since the detection sensitivity for faults remains constant over the full length of the line. This approach is based on the assumption that the reflection usually corresponds approximately to a total reflection, and that the line attenuation increases in proportion to the line length.

In a further preferred embodiment of the method of the invention, a first threshold value is specified for the level of the normalized reflected measurement signal, wherein a fault is detected on the line if the first threshold value is exceeded. A first threshold value can, for example, be specified as −10 dB. It is also however possible for a different suitable threshold value to be determined using empirical values from series of tests, which on the one hand reliably makes faults detectable, and on the other hand keeps the risk of false alarms low.

In a further preferred embodiment of the method of the invention, the compensation of the line attenuation is adjusted with a regular time cycle, in order to compensate for a change in the line attenuation resulting from a temperature change in the environment of the line. The line attenuation can, for example, be adjusted every 10 seconds, every hour or several times in a day. The more often an adjustment takes place, or the reflection measurement is repeated, the more accurately the line attenuation is compensated, and the more reliable becomes the fault detection.

In a further preferred development of the above-described embodiment of the method of the invention, the compensation of the line attenuation is adjusted with every fault-free measurement. This means that every time the method for fault detection is carried out according to the invention on the line the line attenuation is adjusted in order to achieve a constant fault sensitivity, for example over the course of the day.

In a further preferred embodiment of the method of the invention, the reflection location is determined on the basis of a time duration until the reception of the reflected measurement signal, and taking a line attenuation into account. This is an advantage, since changes in the line length caused by the temperature can also be determined.

In a further preferred embodiment of the method of the invention, a second threshold value is specified for the level of the normalized, reflected measurement signal, wherein, if the level falls below the second threshold value, a fault in the measuring assembly and/or a line attenuation that is so large that a reliable fault location determination is not possible is detected. A second threshold value can, for example, be specified as −80 dB. It is also however possible for a different suitable threshold value to be determined using empirical values from series of tests, which on the one hand reliably makes device faults detectable, and on the other hand keeps the risk of undetected faults on the line low.

In a further preferred embodiment of the method of the invention, a return conductor of a high-voltage direct current transmission line, which carries no current when in fault-free operation, is used as the line. The method of the invention can also be advantageously employed on ground electrode lines at HVDC stations.

In a further preferred embodiment of the method of the invention, an overhead line is used as the line. This is an advantage, since, in particular in the case of long overhead lines, an accurate fault detection and determination of the fault location are important.

In a further preferred embodiment of the method of the invention, a pulse method is used for the measurement signal.

In a further preferred embodiment of the method of the invention, a frequency-modulated continuous wave (FMCW) method is used for the measurement signal. A continuous measurement signal, whose working frequency is changed, is fed in here. FMCW methods are, for example, known as frequency-modulated continuous wave radar.

In a further preferred embodiment of the method of the invention, as an alternative and/or in addition to an end reflection at the second end of the line, another reflection location along the course of the line is used for determination of the line attenuation.

On the basis of known measuring assemblies for fault detection on an electrical line, the invention addresses the object of providing a measuring assembly with which a comparatively accurate determination of a fault location can be achieved, in particular in the case of long electrical lines.

The invention achieves this object through a measuring assembly for fault detection on an electrical line, comprising a signal generator apparatus disposed at a first location on the line and configured to feed a measurement signal into the line, a reception apparatus disposed at the first location and configured to receive a reflected measurement signal, an evaluation apparatus configured to determine a fault location on the line on the basis of the time duration until reception of the reflected measurement signal while taking a line attenuation into consideration, a reflection location disposed on the line at which the measurement signal is reflected, the reception apparatus configured to receive the reflected measurement signal from the reflection location, and the evaluation apparatus configured to determine the line attenuation on the basis of the level of the reflected measurement signal received at the first location.

A signal generator apparatus is, for example, a device that is suitable for the generation of a measurement signal in the kilohertz range. A reception apparatus is, in turn, suitable for receiving the reflected measurement signal and possibly amplifying it for a further evaluation. The signal generator apparatus and the reception apparatus can be positioned at the same location for this purpose.

An evaluation apparatus is, for example, a computer with a data memory, wherein the evaluation is performed by software provided for this purpose. The evaluation apparatus can be provided, together with the signal generator apparatus and the reception apparatus, at the same location, or also may be provided centrally, for example as a cloud application at a remote computing center.

Preferred embodiments of the measuring assembly of the invention emerge from the dependent claims.

In a further preferred embodiment of the measuring assembly according to the invention, the reflection location has an impedance apparatus that is suitable for reflecting the measurement signal. The reflection location is, for example, a second line end.

In a further preferred embodiment of the measuring assembly of the invention, the impedance apparatus comprises a choke coil. This is an advantage, since a choke coil brings about a sharp step in the impedance at the end of the line that causes an end reflection and thereby makes the measuring method of the invention possible.

In a further preferred embodiment of the measuring assembly of the invention, the choke coil is provided as part of a power line communication apparatus. On lines with PLC (power line communication) a choke is typically connected in series at both ends of the line to prevent the communication signals transmitted over the power line from propagating beyond the end of the line. Such a choke forms a high impedance at signal frequencies in the kilohertz range.

In a further preferred embodiment of the measuring assembly of the invention, a short circuit between the line and ground is used for the impedance apparatus.

Further variants of the method of the invention as have been described at the beginning, can be implemented without further complication by means of the measuring assembly of the invention.

The same advantages result analogously for the measuring assembly and its embodiments as explained at the outset for the method of the invention.

DETAILED DESCRIPTION OF THE INVENTION

Figure 1:
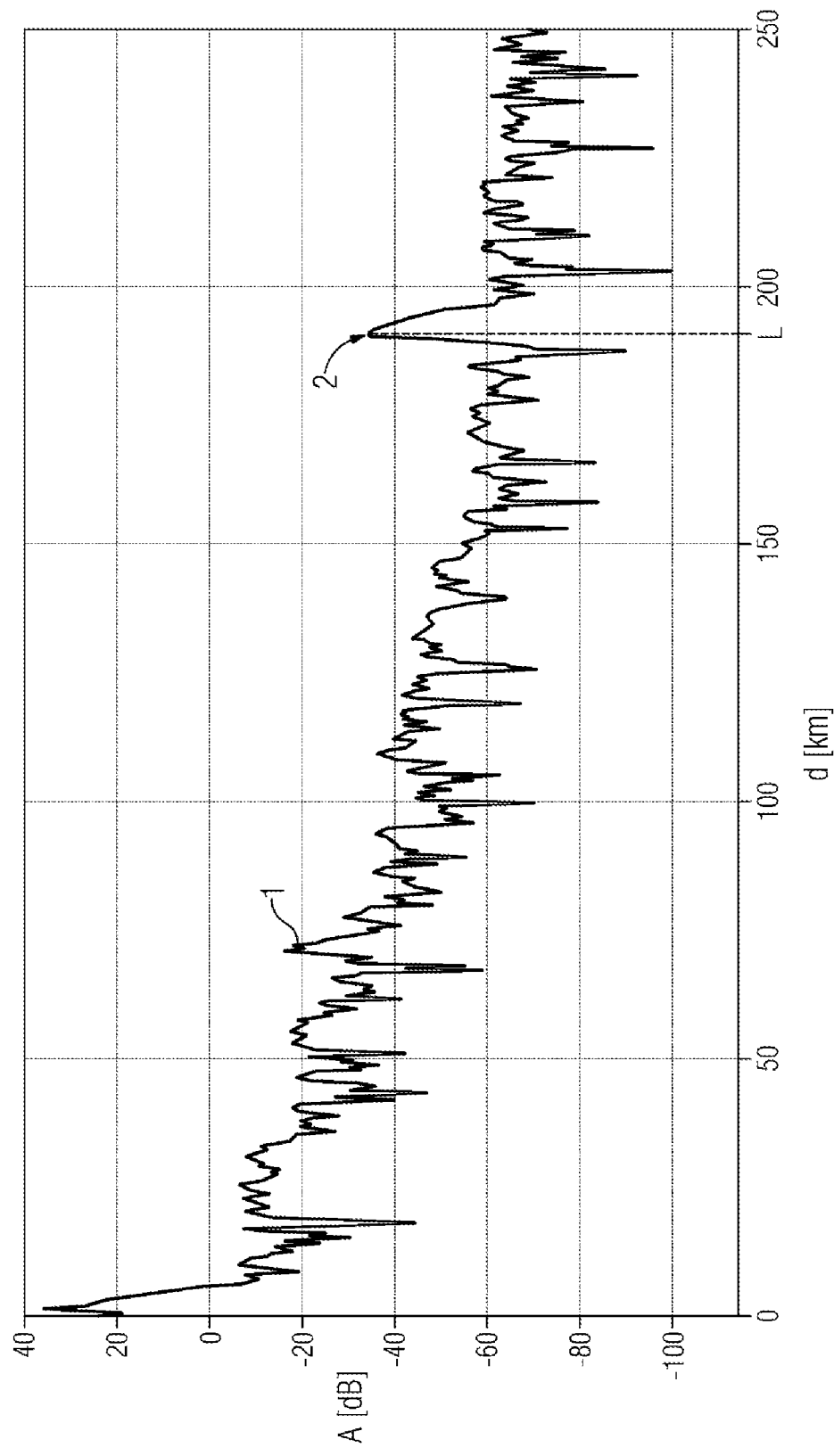
FIG. 1 shows a first schematic reflection diagram of an electrical line.

FIG. 1 shows a first reflection diagram of an electrical line. The length of the line is here plotted in kilometers on the horizontal axis. The level, or the maximum amplitude of a reflected measurement signal 1 received at the first end of the line—at zero kilometers—is plotted in decibels on the vertical axis A. By definition, a received signal level of zero decibels corresponds to the signal level of the original measurement signal that is fed in. In the illustrated example, the line is 190 km long, so that a high level results for an end reflection 2 at the second end of the line at line length L of 190 km. It can be seen that the level of the reflected signal continues to fall with increasing line length.

Figure 2:
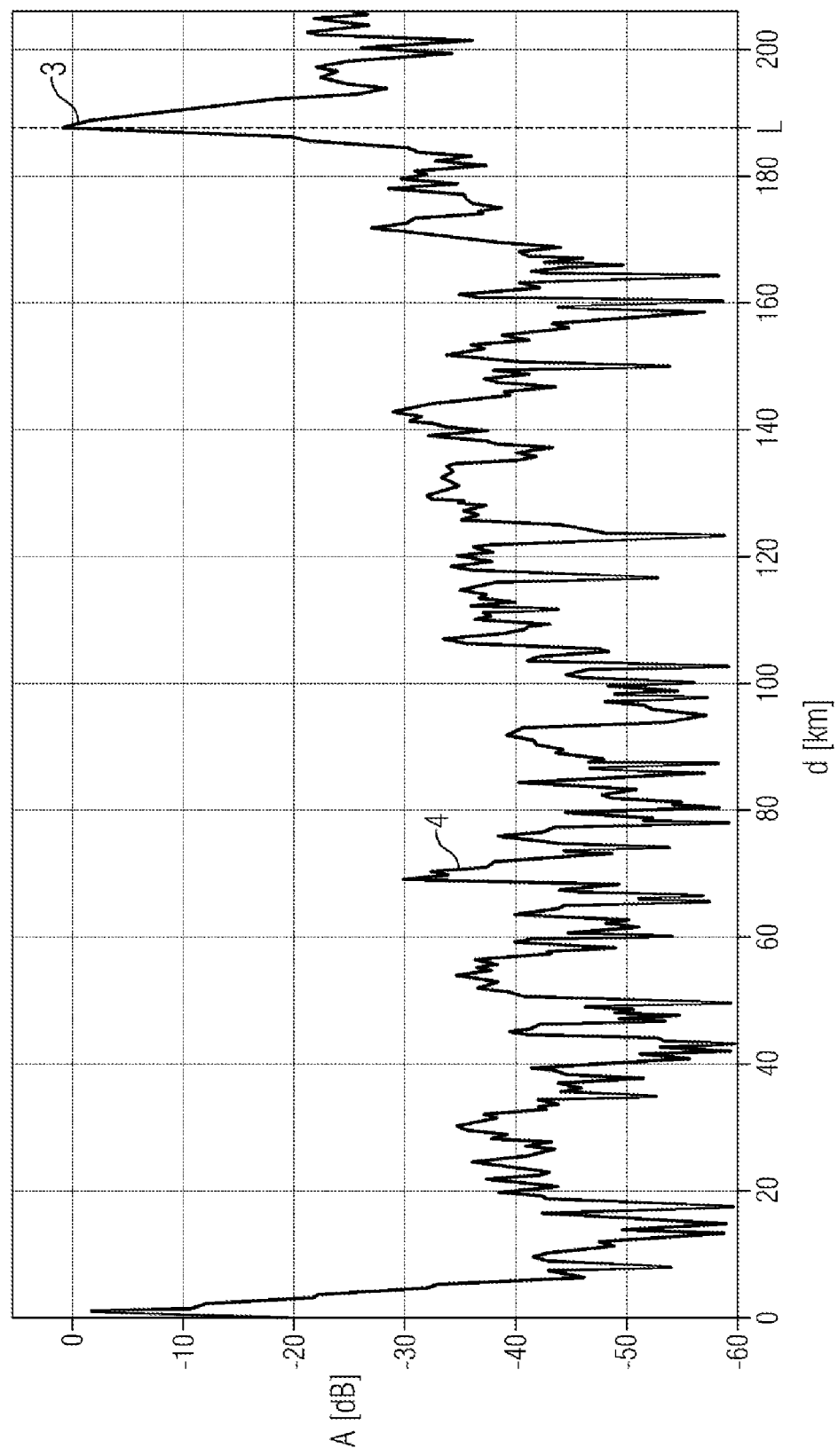
FIG. 2 shows a second schematic reflection diagram of an electrical line with compensation of the line attenuation.

FIG. 2 shows a second reflection diagram of an electrical line with compensation of the line attenuation. The level of the reflection at the line end—the end reflection—is used continuously to determine the line attenuation and to adjust the detection threshold accordingly. The level of the end reflection 2 is determined after each reflection measurement, as for example in FIG. 1. The line attenuation can be compensated making the assumption that the end reflection 2 usually corresponds to a total reflection, and that the line attenuation increases proportionally with the line length. The level of the reflection signal 4 is for this purpose increased linearly with the line length in such a manner that the level of the end reflection 3 in FIG. 2 is at 0 dB.

Figure 3:
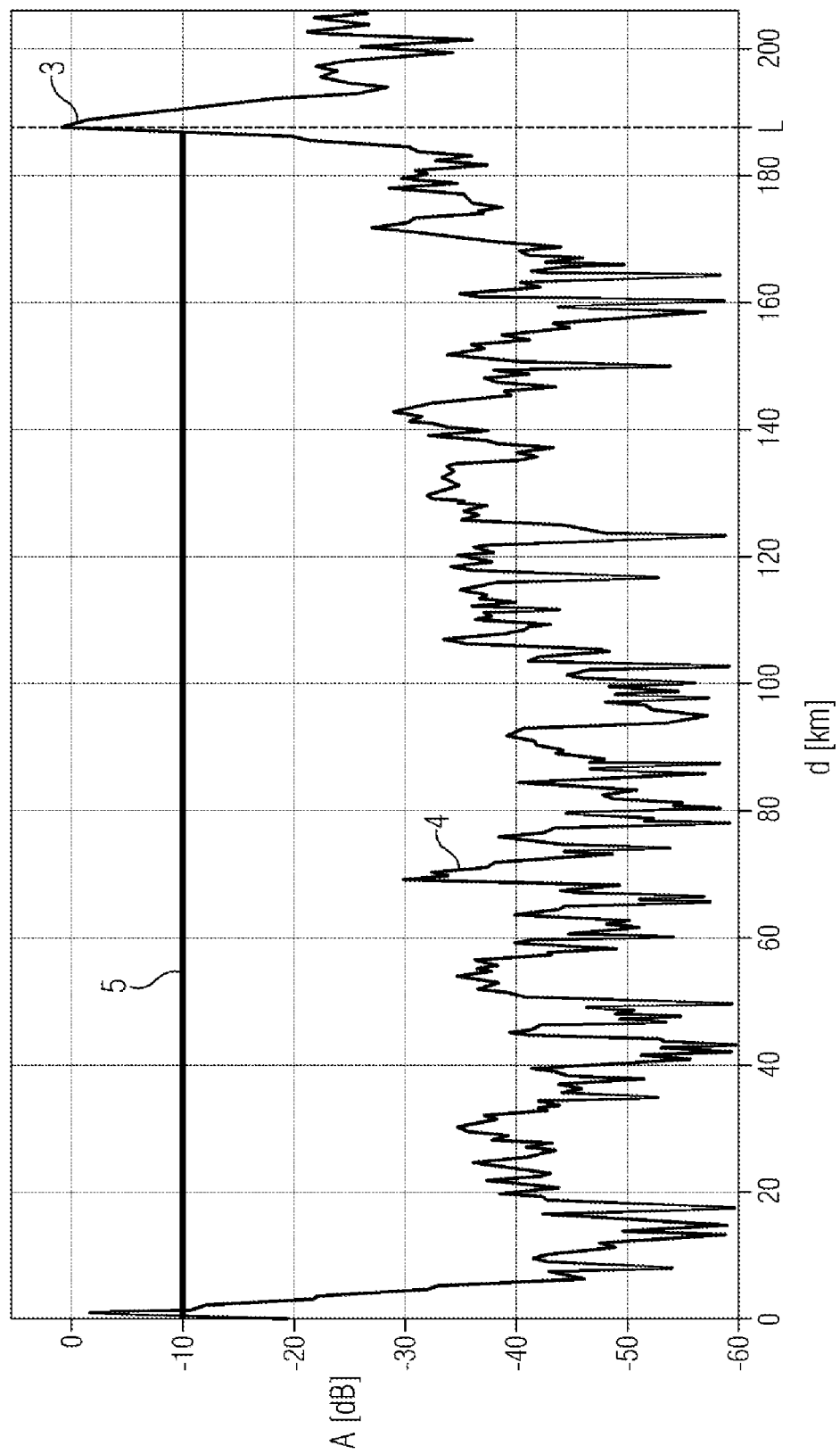
FIG. 3 shows a third schematic reflection diagram of an electrical line with compensation of the line attenuation and a first threshold value for a fault detection.

FIG. 3 shows that a first threshold value can be placed as a horizontal line 5 with a specified clearance underneath the zero line (zero decibels) as a detection threshold for line faults. A constant sensitivity to faults over the entire line length is achieved in this way, which is a significant advantage of the method of the invention.

This method is, for example, both applied to the first measurement following installation as well as in further operation in order to determine the line attenuation continuously and to compensate for it at the next measurement.

Figure 4:
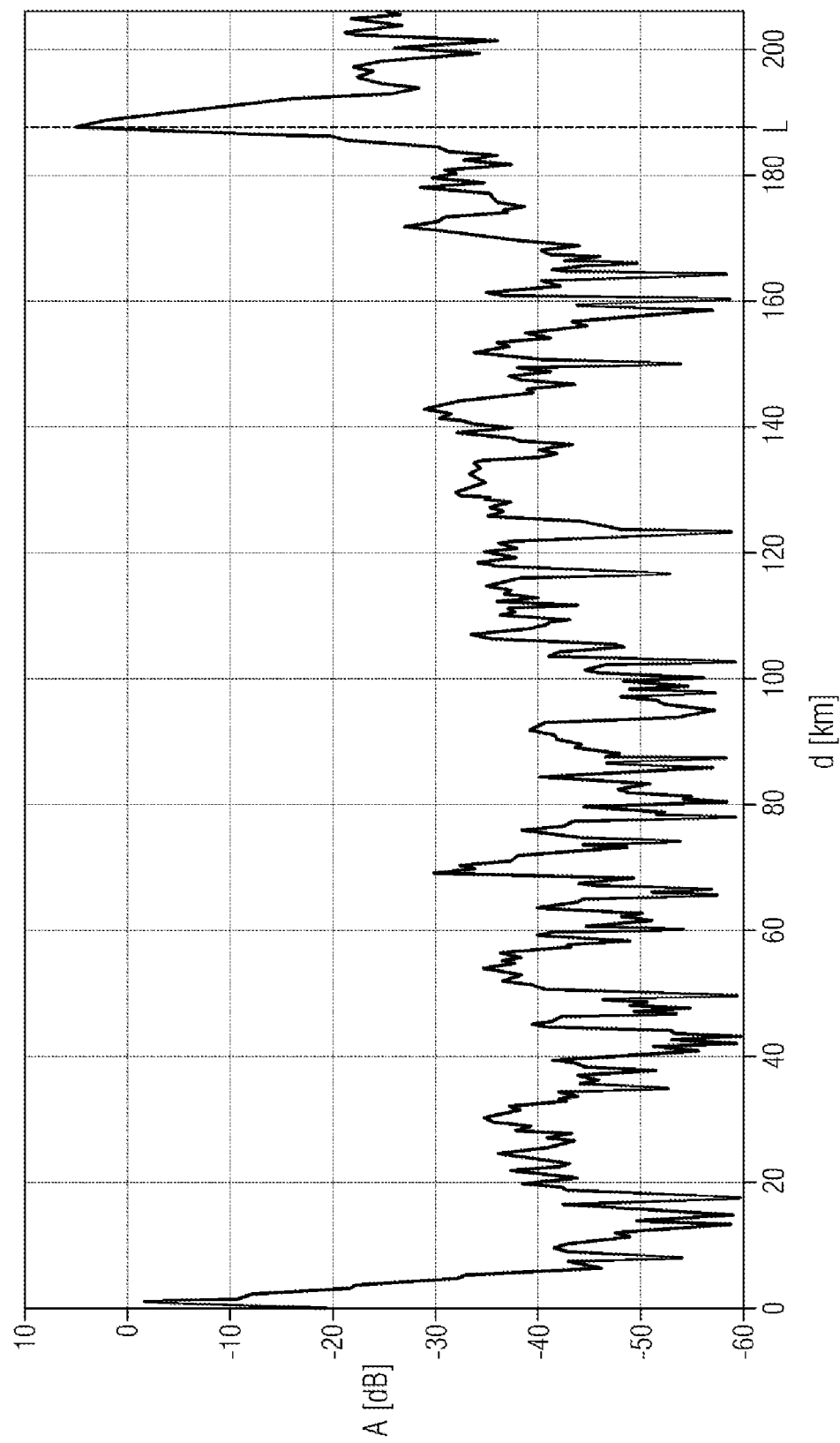
FIG. 4 shows a fourth schematic reflection diagram of an electrical line with changed line attenuation.

FIG. 4 shows a measurement in which the actual line attenuation differs from the previously compensated line attenuation, and should be adjusted in the next measurement. The level of the end reflection lies a few decibels above the zero line. The reflection diagram should again correspond to FIG. 2 after the adjustment.

A typical frequency range for a reflection measurement with a measurement signal in high-voltage lines lies between 30 kHz and 5 MHz.

Figure 5:
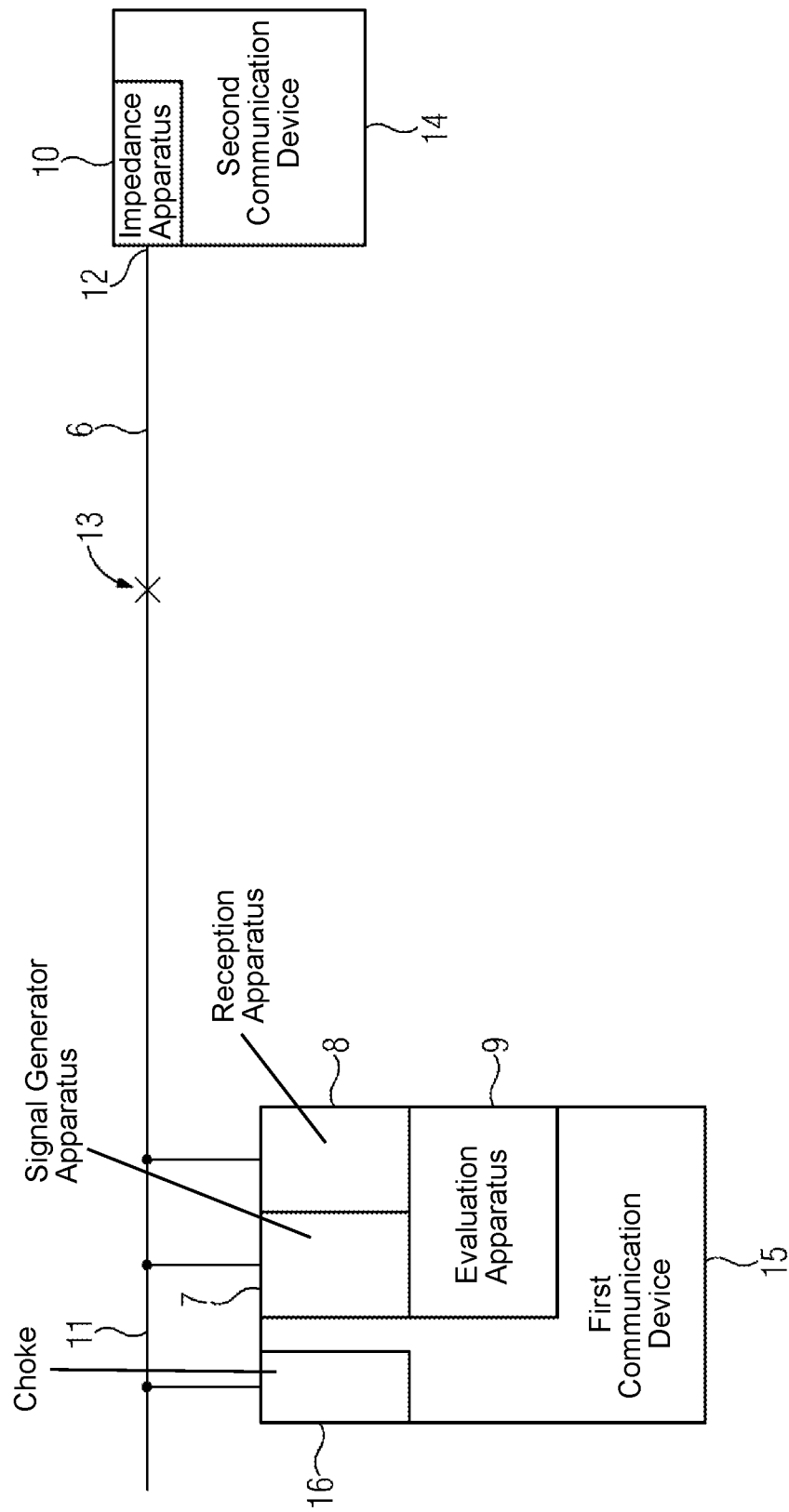
FIG. 5 schematically shows a measuring assembly.

FIG. 5 shows a measuring assembly 7, 8, 9, 10 for fault detection on an electrical line 6, comprising a signal generator apparatus 7 that is arranged at a first end 11 of the line 6 and is designed to feed a measurement signal into the first end 11 of the line 6. A reception apparatus 8 that is arranged at the first end 11 of the line 6 is designed to receive the reflected measurement signal.

An evaluation apparatus 9 is designed to determine a fault location 13 on the line 6 on the basis of the time duration until reception of the reflected measurement signal while taking a line attenuation into consideration.

The signal generator apparatus 7 and the reception apparatus 8 are integrated, together with the evaluation apparatus 9, into a first communication device 15 for power line communication over the line 6. The first communication device 15 comprises a choke 16.

An impedance apparatus 10 that is designed as a choke 10 and is integrated into a second communication device 14 for power line communication over the line 6 is arranged at the second line end 12. The choke 10 is suitable for reflecting the measurement signal.

The reception apparatus 8 is further designed to receive the end reflection of the measurement signal from the second line end 12. The evaluation apparatus 9 is designed as a conventional computer, and can determine the line attenuation on the basis of the level of the end reflection.

The invention claimed is:

1. A method for fault detection on an electrical line, the method comprising:
   feeding-in a measurement signal at a first location on the line;
   reflecting the measurement signal at a reflection location on the line;
   receiving the reflected measurement signal at the first location;
   determining a fault location on the line based on a time duration until reception of the reflected measurement signal while taking a line attenuation into consideration;
   determining the line attenuation based on a level of the reflected measurement signal received at the first location; and
   compensating the line attenuation by normalizing the level of the measurement signal reflected from the reflection location to zero decibels, and raising the level of the reflected measurement signal linearly along a length of the line.

2. The method according to claim 1, which further comprises providing a choke coil at the reflection location.

3. The method according to claim 1, which further comprises providing the measurement signal in a kilohertz frequency range.

4. The method according to claim 1, which further comprises providing the measurement signal with a frequency in a frequency range of from 50 kHz to 5 MHz.

5. The method according to claim 1, which further comprises specifying a first threshold value for the level of the normalized reflected measurement signal, and detecting a fault on the line upon exceeding the first threshold value.

6. The method according to claim 1, which further comprises adjusting the compensation of the line attenuation with a time cycle, in order to compensate for a change in the line attenuation resulting from a temperature change in an environment of the line.

7. The method according to claim 1, which further comprises determining the reflection location based on the time duration until the reception of the reflected measurement signal and taking the line attenuation into account.

8. The method according to claim 5, which further comprises specifying a second threshold value for the level of the normalized reflected measurement signal, and detecting at least one of a fault or a line attenuation being so large that a reliable fault location determination is not possible, when the level falls below the second threshold value.

9. A measuring assembly for fault detection on an electrical line, the measuring assembly comprising:
   a signal generator apparatus disposed at a first location on the line and configured to feed a measurement signal into the line;
   a receiver disposed at the first location and configured to receive a reflected measurement signal reflected from a reflection location on the line; and
   an evaluator configured to determine a fault location on the line based on a time duration until reception of the reflected measurement signal while taking a line attenuation into consideration, said evaluator configured to determine the line attenuation based on a level of the reflected measurement signal received at the first location, and said evaluator configured to compensate the line attenuation by normalizing the level of the measurement signal reflected from the reflection location to zero decibels, and raising the level of the reflected measurement signal linearly along a length of the line.

10. The measuring assembly according to claim 9, wherein said evaluator is configured to specify a first threshold value for the level of the normalized reflected measurement signal, permitting a fault to be detected on the line upon exceeding the first threshold value.

11. The measuring assembly according to claim 9, wherein said evaluator is configured to adjust the compensation of the line attenuation with a time cycle, to compensate for a change in the line attenuation resulting from a temperature change in an environment of the line.

12. The measuring assembly according to claim 9, wherein said evaluator is configured to determine the reflection location based on the time duration until reception of the reflected measurement signal and taking the line attenuation into consideration.

\* \* \* \* \*